US008427416B2

(12) United States Patent
Tsou

(10) Patent No.: US 8,427,416 B2
(45) Date of Patent: Apr. 23, 2013

(54) DISPLAY PANEL

(75) Inventor: Yuan-Hsin Tsou, Kaohsiung County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 380 days.

(21) Appl. No.: 12/768,734

(22) Filed: Apr. 28, 2010

(65) Prior Publication Data

US 2011/0221721 A1 Sep. 15, 2011

(30) Foreign Application Priority Data

Mar. 11, 2010 (TW) ................................ 99107145 A

(51) Int. Cl.
*G09G 3/36* (2006.01)
(52) U.S. Cl.
USPC ............................................ 345/100; 345/98
(58) Field of Classification Search ............. 345/98–100
See application file for complete search history.

(56) References Cited

U.S. PATENT DOCUMENTS

| 2003/0174118 A1* | 9/2003 | Sato et al. ...................... 345/100 |
| 2008/0012819 A1* | 1/2008 | Lee et al. ....................... 345/100 |
| 2008/0088555 A1 | 4/2008 | Shin et al. |

FOREIGN PATENT DOCUMENTS

TW  I295457  4/2008

* cited by examiner

*Primary Examiner* — Kevin M Nguyen
(74) *Attorney, Agent, or Firm* — Jianq Chyun IP Office

(57) ABSTRACT

A display panel is provided. A plurality of first shift registers of the display panel output a plurality of first scanning signals in sequence. A plurality of second shift registers of the display panel output a plurality of second scanning signals in sequence. The $j^{th}$ first shift registers stops outputting the $j^{th}$ first scanning signal according to the $j^{th}$ second scanning signal, wherein j is a positive integer. The $j^{th}$ second shift registers stops outputting the $j^{th}$ scanning signal according to the $(j+1)^{th}$ first scanning signal. Therefore, two scanning signals neighboring in clocking sequence are avoided from overlapping.

7 Claims, 4 Drawing Sheets

DISPLAY PANEL

CROSS-REFERENCE TO RELATED APPLICATION

This application claims the priority benefit of Taiwan application serial no. 99107145, filed on Mar. 11, 2010. The entirety of the above-mentioned patent application is hereby incorporated by reference herein and made a part of specification.

BACKGROUND OF THE INVENTION

1. Field of the Invention

The invention relates to a display panel, and more particularly, to a liquid crystal display (LCD) panel.

2. Description of Related Art

Due to rapidly advancing semiconductor technologies in the recent years, portable electronics and flat displays have also gained popularity. In various types of flat displays, liquid crystal displays (LCDs) have gradually become the main stream of display products due to features such as low voltage operation, radiation-free scattering, light weight, compactness, and the like.

In order to reduce the manufacturing cost of LCDs, some manufacturers have proposed to manufacture multi-level shift registers directly on glass substrates by adopting thin film transistors (TFTs), thereby replacing conventional gate driving chips. According to various circuit designs, a center portion of a substrate is served as a display region so that the gate driving circuit is divided into two portions which are disposed at two reverse sides of the substrate.

The two portions of the gate driving circuit respectively output a plurality of scanning signals to different scan lines in the display region according to different clock signals so as to drive corresponding pixels on different scan lines in the display region. Different clock signals are referred by the two portions of the gate driving circuit so that the scanning signals generated therefrom are overlapped to write the display data into wrong pixels. For preventing the scanning signals from overlapping with one another, a synchronizing mechanism is required between the two portions of the gate driving circuit so that the scanning signals generated from the two portions of the gate driving circuit are alternatively outputted but not overlapped with one another.

SUMMARY OF THE INVENTION

The invention provides a display panel which renders the gate driving circuit divided into two portions at two sides alternatively output scanning signals and stop outputting scanning signals when the subsequent scanning signal is outputted.

The invention provides a display panel including a substrate, a pixel array, a plurality of first shift registers, and a plurality of second shift registers. The pixel array is disposed on the substrate. The first shift registers are disposed on the substrate for outputting a plurality of first scanning signals sequentially. The second shift registers are disposed on the substrate for outputting a plurality of second scanning signals sequentially. A $j^{th}$ first shift register stops outputting a $j^{th}$ first scanning signal according to a $j^{th}$ second scanning signal, wherein j is a positive integer. A $j^{th}$ second shift register stops outputting the $j^{th}$ second scanning signal according to a $(j+1)^{th}$ first scanning signal. The first scanning signals and the second scanning signals are used for driving the pixel array.

According to an embodiment of the invention, each of the first shift registers includes a first transistor, a second transistor, a third transistor, a fourth transistor, a fifth transistor, a sixth transistor, a seventh transistor, an eighth transistor, a ninth transistor, a first capacitor, and a second capacitor. A first terminal of the first transistor is coupled to a control terminal of the first transistor. A first terminal of the second transistor is coupled to the first terminal of the first transistor and a second terminal of the second transistor is coupled to a second terminal of the first transistor. A first terminal of the third transistor is coupled to the second terminal of the first transistor and a second terminal of the third transistor is coupled to a gate low voltage. A first terminal of the fourth transistor is coupled to the second terminal of the first transistor and a second terminal of the fourth transistor is coupled to the gate low voltage. A first terminal of the fifth transistor is coupled to a control terminal of the fourth transistor, a second terminal of the fifth transistor is coupled to the gate low voltage, and a control terminal of the fifth transistor is coupled to the second terminal of the first transistor. A control terminal of the sixth transistor is coupled to the second terminal of the first transistor. A first terminal of the seventh transistor is coupled to a second terminal of the sixth transistor, a second terminal of the seventh transistor is coupled to the gate low voltage, and a control terminal of the seventh transistor is coupled to the control terminal of the fourth transistor. A first terminal of the eighth transistor is coupled to the second terminal of the sixth transistor and a second terminal of the eighth transistor is coupled to the gate low voltage. A first terminal of the ninth transistor is coupled to the second terminal of the sixth transistor and a second terminal of the ninth transistor is coupled to the gate low voltage. The first capacitor is coupled between a first terminal of the sixth transistor and the first terminal of the fifth transistor. The second capacitor is coupled between the second terminal of the sixth transistor and the control terminal of the sixth transistor. In a $1^{st}$ first shift register, the first terminal of the first transistor receives a start signal, the control terminal of the second transistor and the control terminal of the eighth transistor receive a reverse signal of a first clocking signal, a control terminal of the third transistor and a control terminal of the ninth transistor receive a $1^{st}$ second scanning signal, the first terminal of the sixth transistor receives the first clocking signal, and the second terminal of the sixth transistor outputs the $1^{st}$ first scanning signal. In a $2j^{th}$ first shift register, the first terminal of the first transistor receives a $(2j-1)^{th}$ second scanning signal, the control terminal of the second transistor and the control terminal of the eighth transistor receive the first clocking signal, the control terminal of the third transistor and the control terminal of the ninth transistor receive a $2j^{th}$ second scanning signal, the first terminal of the sixth transistor receives the reverse signal of the first clocking signal, and the second terminal of the sixth transistor outputs a $2j^{th}$ first scanning signal. In a $(2j+1)^{th}$ first shift register, the first terminal of the first transistor receives a $2j^{th}$ second scanning signal, the control terminal of the second transistor and the control terminal of the eighth transistor receive the reverse signal of the first clocking signal, the control terminal of the third transistor and the control terminal of the ninth transistor receive a $(2j+1)^{th}$ second scanning signal, the first terminal of the sixth transistor receives the first clocking signal, and the second terminal of the sixth transistor outputs a $(2j+1)^{th}$ first scanning signal.

According to an embodiment of the invention, each of the second shift registers includes a tenth transistor, an eleventh transistor, a twelfth transistor, a thirteenth transistor, a fourteenth transistor, a fifteenth transistor, a sixteenth transistor, a seventeenth transistor, an eighteenth transistor, a third capacitor, and a fourth capacitor. A first terminal of the tenth transistor is coupled to a control terminal of the tenth transistor. A first terminal of the eleventh transistor is coupled to the first terminal of the tenth transistor and a second terminal of the eleventh transistor is coupled to a second terminal of the tenth transistor. A first terminal of the twelfth transistor is coupled to the second terminal of the tenth transistor and a second terminal of the twelfth transistor is coupled to a gate low voltage. A first terminal of the thirteenth transistor is coupled to the second terminal of the tenth transistor and a second terminal of the thirteenth transistor is coupled to the gate low voltage. A first terminal of the fourteenth transistor is coupled to a control terminal of the thirteenth transistor, a second terminal of the fourteenth transistor is coupled to the gate low voltage, and a control terminal of the fourteenth transistor is coupled to the second terminal of the tenth transistor. A control terminal of the fifteenth transistor is coupled to the second terminal of the tenth transistor. A first terminal of the sixteenth transistor is coupled to a second terminal of the fifteenth transistor, a second terminal of the sixteenth transistor is coupled to the gate low voltage, and a control terminal of the sixteenth transistor is coupled to the control terminal of the thirteenth transistor. A first terminal of the seventeenth transistor is coupled to the second terminal of the fifteenth transistor and a second terminal of the seventeenth transistor is coupled to the gate low voltage. A first terminal of the eighteenth transistor is coupled to the second terminal of the fifteenth transistor and a second terminal of the eighteenth transistor is coupled to the gate low voltage. The third capacitor is coupled between a first terminal of the fifteenth transistor and the first terminal of the fourteenth transistor. The fourth capacitor is coupled between the second terminal of the fifteenth transistor and the control terminal of the fifteenth transistor. In a $(2j-1)^{th}$ second shift register, the first terminal of the tenth transistor receives a $(2j-1)^{th}$ first scanning signal, the control terminal of the eleventh transistor and the control terminal of the seventeenth transistor receive a reverse signal of a second clocking signal, the control terminal of the twelfth transistor and the control terminal of the eighteenth transistor receive a $2j^{th}$ first scanning signal, the first terminal of the fifteenth transistor receives the second clocking signal, and the second terminal of the fifteenth transistor outputs a $(2j-1)^{th}$ second scanning signal. in a $2j^{th}$ second shift register, the first terminal of the tenth transistor receives a $2j^{th}$ first scanning signal, the control terminal of the eleventh transistor and the control terminal of the seventeenth transistor receive the second clocking signal, the control terminal of the twelfth transistor and the control terminal of the eighteenth transistor receive a $(2j+1)^{th}$ first scanning signal, the first terminal of the fifteenth transistor receives the reverse signal of the second clocking signal, and the second terminal of the fifteenth transistor outputs a $2j^{th}$ second scanning signal.

According to an embodiment of the invention, the pixels in odd rows of the pixel array are driven by the first scanning signals and pixels in even rows of the pixel array are driven by the second scanning signals.

According to an embodiment of the invention, pixels in each row of the pixel array are corresponding to two scan lines.

According to an embodiment of the invention, odd pixels in each row of the pixel array are driven by the first scanning signals and even pixels in each row of the pixel array are driven by the second scanning signals.

In view of the above, in the display panel of the invention, each shift register stops outputting the outputted scanning signals when the subsequent scanning signal is outputted. Thereby, the scanning signals are prevented from overlapping with one another.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
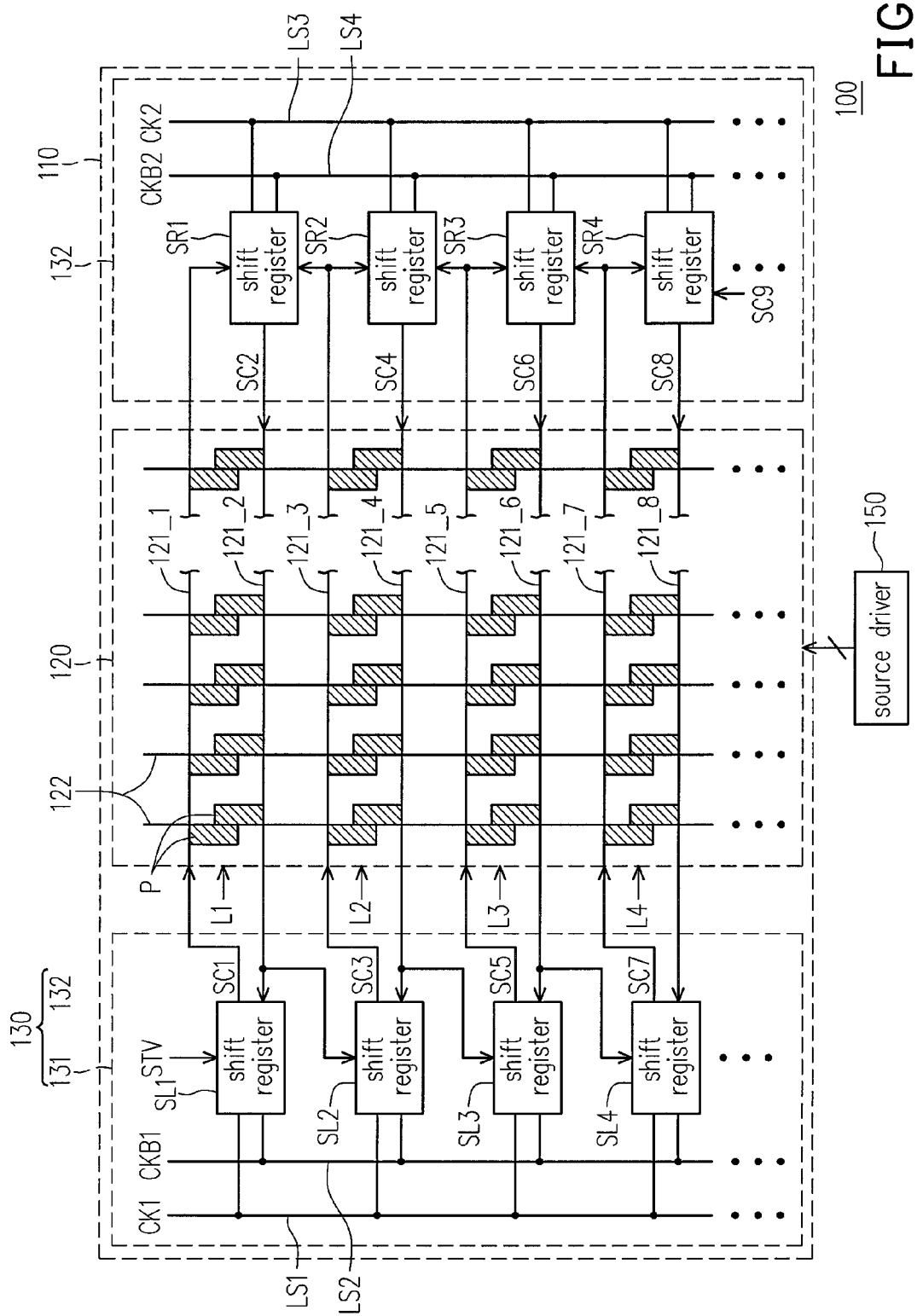
FIG. 1 is a schematic system diagram of a display according to an embodiment of the invention.

FIG. 1 is a schematic system diagram of a display according to an embodiment of the invention. Referring to FIG. 1, the display 100 includes a display panel 110 and a source driver 150. The display panel 110 includes a pixel array 120 and gate driving circuits 131 and 132, wherein the functions of the gate driving circuits 131 and 132 can be combined to be served as a gate driver 130. In the present embodiment, the gate driving circuit 131 is disposed on a substrate of the display panel 110 and located at a left side (such as a first side) of the pixel array 120. The gate driving circuit 132 is disposed on the substrate of the display panel 110 and located at a right side (such as a second side) of the pixel array 120. Furthermore, the pixel array 120 on the substrate of the display panel 110 defines as a display region of the display panel 110 and the region disposed with the gate driving circuits 131 and 132 define as a non-display region of the display panel 110.

Herein, the pixel array 120 are exemplified as a pixel array having dual gate structure, i.e. each pixel row of the pixel array 120 is corresponding to two scan lines and every two pixels in each pixel row share the same data line. As shown in FIG. 1, the pixel array 120 has a plurality of scan lines (such as 121_1 to 121_8) and a plurality of data lines 122, and a plurality of pixels P between two scan lines (such as 121_1 and 121_2) forms a pixel row (such as L1), wherein the drawing merely shows the coupled relationship of the pixels P, but does not show the real structure thereof.

In the pixel row L1, if looking at the figure in the direction from the left side to the right side, the odd pixels P in the pixel row L1 are driven by the scanning signals (such as SC1) transmitted through the scan line 121_1 to receive the display data transmitted through the coupled data line 122, and the even pixels P in the pixel row L1 are driven by the scanning signals (such as SC2) transmitted through the scan line 121_2 to receive the display data transmitted through the coupled data line 122. The driving method of other pixels P in other pixel rows (such as L2 to L4) is similar to that of the pixels P in the pixel row L1 and is not reiterated here.

The source driver 150 is used for outputting a plurality of display data to each data line 122 to transmit the display data to the driven pixels P through the data lines 122. The gate driver 131 sequentially outputs the scanning signals SC1, SC3, SC5, SC7, and the like (i.e. the first scanning signals) for driving the odd pixels P in each pixel row in the pixel array 120. Similarly, the gate driver 132 sequentially outputs the scanning signals SC2, SC4, SC6, SC8, and the like (i.e. the second scanning signals) for driving the even pixels P in each pixel row in the pixel array 120. After the pixels in the pixel array 120 are driven, the source driver 350 outputs the corresponding display data to write into the driven pixels.

The gate driving circuit 131 includes shift registers SL1, SL2, SL3, SL4, and the like (i.e. first shift registers). The shift registers SL1, SL2, SL3, SL4 . . . etc. simultaneously receive a clocking signal CK1 (i.e. a first clocking signal) and a clocking signal CKB1 (i.e. a reverse signal of the first clocking signal). The clocking signal CK1 is transmitted to the shift registers SL1, SL2, SL3, SL4 . . . etc. through the signal line LS1 disposed on the substrate of the display panel 110 and the clocking signal CKB1 is transmitted to the shift registers SL1, SL2, SL3, SL4 . . . etc. through the signal line LS2 disposed on the substrate of the display panel 110. Moreover, the signal lines LS1 and LS2 can be disposed in the gate driving circuit 131.

The gate driving circuit 132 includes shift registers SR1, SR2, SR3, SR4, and the like (i.e. second shift registers). The shift registers SR1, SR2, SR3, SR4 . . . etc. simultaneously receive a clocking signal CK2 (i.e. a second clocking signal) and a clocking signal CKB2 (i.e. a reverse signal of the second clocking signal). The clocking signal CK2 is transmitted to the shift registers SR1, SR2, SR3, SR4 . . . etc. through the signal line LS3 disposed on the substrate of the display panel 110 and the clocking signal CKB2 is transmitted to the shift registers SR1, SR2, SR3, SR4 . . . etc. through the signal line LS4 disposed on the substrate of the display panel 110. Moreover, the signal lines LS3 and LS4 can be disposed in the gate driving circuit 132.

Figure 2:
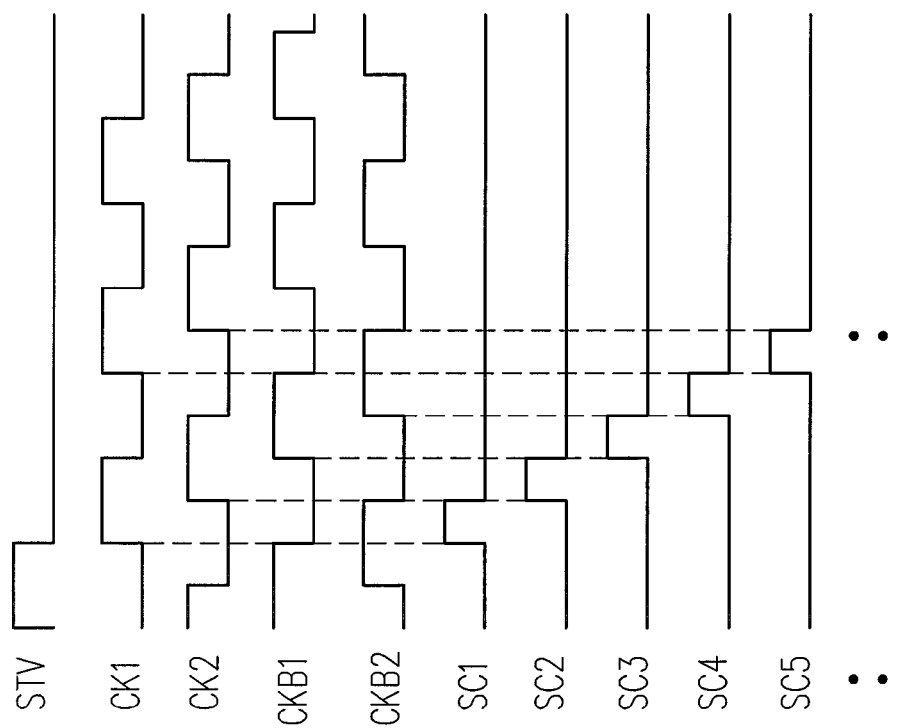
FIG. 2 is a schematic diagram showing a driving waveform of the display panel in FIG. 1 according to an embodiment of the invention.

FIG. 2 is a schematic diagram showing a driving waveform of the display panel in FIG. 1 according to an embodiment of the invention. Referring to FIG. 1 and FIG. 2, in the present embodiment, the shift register SL1 is configured as in a driven mode when the shift register SL1 receives a start signal STV. Subsequent, when the clocking signal CK1 received by the shift register SL1 is "enable" (e.g. a high level voltage is exemplified here) and the clocking signal CKB1 received by the shift register SL1 is "disable" (e.g. a low level voltage is exemplified here), the shift register SL1 can output the scanning signal SC1. In other words, the shift register SL1 outputs the scanning signal SC1 according to the start signal STV, the clocking signal CK1, and the clocking signal CKB1. In addition, the scanning signal SC1 is transmitted to the shift register SR1 through the scan line 121_1 of the pixel array 120.

The shift register SR1 is configured as in a driven mode when the shift register SR1 receives the scanning signal SC1. Subsequent, when the clocking signal CK2 received by the shift register SR1 is "enable" and the clocking signal CKB2 is "disable", the shift register SR1 can output the scanning signal SC2. In other words, the shift register SR1 outputs the scanning signal SC2 according to the scanning signal SC1, the clocking signal CK2, and the clocking signal CKB2. In addition, the scanning signal SC2 is transmitted to the shift registers SL1 and SL2 through the scan line 121_2 of the pixel array 120. When the shift register SL1 receives the scanning signal SC2, the shift register SL1 states in a stop mode to stop outputting the scanning signal SC1 so as to prevent the scanning signal SC1 and the scanning signal SC2 from overlapping with each other.

The shift register SL2 is configured as in a driven mode when the shift register SL2 receives the scanning signal SC2. Subsequent, when the clocking signal CK1 received by the shift register SL2 is "disable" and the clocking signal CKB1 received by the shift register SL2 is "enable", the shift register SL2 can output the scanning signal SC3. In other words, the shift register SL2 outputs the scanning signal SC3 according to the scanning signal SC2, the clocking signal CK1, and the clocking signal CKB1. In addition, the scanning signal SC3 is transmitted to the shift registers SR1 and SR2 through the scan line 121_3 of the pixel array 120. When the shift register SR1 receives the scanning signal SC3, the shift register SR1 states in a stop mode to stop outputting the scanning signal SC2 so as to prevent the scanning signal SC2 and the scanning signal SC3 from overlapping with each other.

The shift register SR2 is configured as in a driven mode when the shift register SR2 receives the scanning signal SC3. Subsequent, when the clocking signal CK2 received by the shift register SR2 is "disable" and the clocking signal CKB2 received by the shift register SR2 is "enable", the shift register SR2 can output the scanning signal SC4. In other words, the shift register SR2 outputs the scanning signal SC4 according to the scanning signal SC3, the clocking signal CK2, and the clocking signal CKB2. In addition, the scanning signal SC4 is transmitted to the shift registers SL2 and SL3 through the scan line 121_4 of the pixel array 120. When the shift register SL2 receives the scanning signal SC4, the shift register SL2 states in the stop mode to stop outputting the scanning signal SC3 so as to prevent the scanning signal SC3 and the scanning signal SC4 from overlapping with each other.

The shift register SL3 is configured as in a driven mode when the shift register SL3 receives the scanning signal SC4. Subsequent, when the clocking signal CK1 received by the shift register SL3 is "enable" and the clocking signal CKB1 received by the shift register SL3 is "disable", the shift register SL3 can output the scanning signal SC5. In other words, the shift register SL3 outputs the scanning signal SC5 according to the scanning signal SC4, the clocking signal CK1, and the clocking signal CKB1. In addition, the scanning signal SC5 is transmitted to the shift registers SR2 and SR3 through the scan line 121_5 of the pixel array 120. When the shift register SR2 receives the scanning signal SC5, the shift register SR2 states in the stop mode to stop outputting the scanning signal SC4 so as to prevent the scanning signal SC4 and the scanning signal SC5 from overlapping with each other.

The operation method of other shift registers (such as SR3, SL4, SR4, and the like) is speculated from the aforesaid description and corresponding signals (such as SC6, SC7, SC8, and the like) can be outputted thereby. The gate drivers 131 and 132 alternatively output the scanning signals SC1, SC2, SC3 . . . to the scan lines 121_1, 121_2, 121_3 . . . for driving the pixels P coupled to the scan lines 121_1, 121_2, 121_3, and the like.

Figure 3:
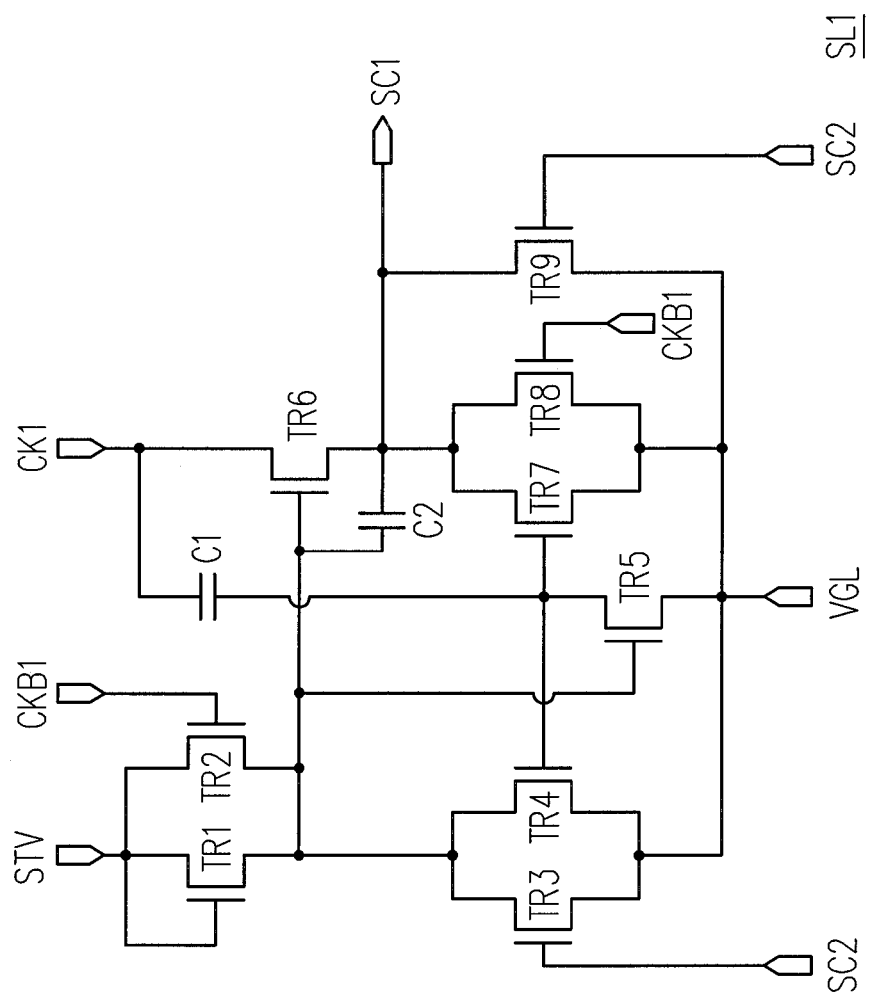
FIG. 3 is a schematic circuit diagram of the shift register SL1 in FIG. 1 according to an embodiment of the invention.

FIG. 3 is a schematic circuit diagram of the shift register SL1 in FIG. 1 according to an embodiment of the invention. Referring to FIG. 3, the shift registers SL1 includes transistors TR1 to TR9 and capacitors C1 and C2. The drain (i.e. the first terminal) of the transistor TR1 receives the start signal STV and the gate (i.e. the control terminal) of the transistor TR1 is coupled to the drain of the transistor TR1. The drain of the transistor TR2 is coupled to the drain of the transistor TR1, the source (i.e. the second terminal) of the transistor TR2 is coupled to the source of the transistor TR1, and the gate of the transistor TR2 receives the clocking signal CKB1. The drain of the transistor TR3 is coupled to the source of the transistor TR1, the source of the transistor TR3 is coupled to a gate low voltage VGL, and the gate of the transistor TR3 receives the scanning signal SC2. The drain of the transistor TR4 is coupled to the source of the transistor TR1 and the source of the transistor TR4 is coupled to the gate low voltage VGL.

The drain of the transistor TR5 is coupled to the gate of the transistor TR4, the source of the transistor TR5 is coupled to the gate low voltage VGL, and the gate of the transistor TR5 is coupled to the source of the transistor TR1. The drain of the transistor TR6 receives the clocking signal CK1, the source of the transistor TR6 outputs the scanning signal SC1, and the gate of the transistor TR6 is coupled to the source of the transistor TR1. The drain of the transistor TR7 is coupled to the source of the transistor TR6, the source of the transistor TR7 is coupled to the gate low voltage VGL, and the gate of the transistor TR7 is coupled to the gate of the transistor TR4. The drain of the transistor TR8 is coupled to the source of the transistor TR6, the source of the transistor TR8 is coupled to the gate low voltage VGL, and the gate of the transistor TR8 receives the clocking signal CKB1. The drain of the transistor TR9 is coupled to the source of the transistor TR6, the source of the transistor TR9 is coupled to the gate low voltage VGL, and the gate of the transistor TR9 receives the scanning signal SC2. The capacitor C1 is coupled between the drain of the transistor TR6 and the drain of the transistor TR5. The capacitor C2 is coupled between the gate of the transistor TR6 and the source of the transistor TR6.

When the transistor TR1 receives the start signal STV, the transistor TR1 is in a conducted mode by the start signal STV to output the start signal STV and charge the capacitor C2. When the voltage of the capacitor C2 is higher than the threshold voltage of the transistor TR5 and TR6, the transistors TR5 and TR6 are in the conducted mode and the shift register SL1 is in the driven mode. Furthermore, the conducted transistor TR5 can transmit the gate low voltage (i.e. the low level voltage) to the gates of the transistors TR4 and TR7 so that the transistors TR4 and TR7 are in a non-conducted mode so as to prevent the transistors TR4 and TR7 from generating a mis-action to be conducted.

Subsequent, when the clocking signal CK1 is "enable", the transistor TR6 can output an enable clocking signal CK1 for serving as a scanning signal SC1, and the capacitor C2 and the transistor TR6 are in a bootstrap configuration so that the transistor TR6 can maintain in the conducted mode to continuously output the scanning signal SC1. Thereafter, the transistors TR3 and TR9 are in the conducted mode when the gates of the transistors TR3 and TR9 receives the scanning signal SC2. The conducted transistor TR9 can instantly pull down the voltage of the source of the transistor TR6 to the low level voltage for stopping outputting the scanning signal SC1. The conducted transistor TR3 can pull down the voltage of the gate of the transistor TR6 for rendering the transistor TR6 in the non-conducted mode so that the shift register SL1 states in a stop mode.

Then, the transistor TR2 and TR8 are in the conducted mode when the clocking signal CKB1 is "enable". The conducted transistor TR8 similarly pull down the voltage of the source of the transistor TR6 to the low level voltage. In addition, besides the time at which the tart signal is receiving, the drain of the transistor TR2 can receive the low level voltage so that the conducted transistor TR2 is conducive to pull down the voltage of the gate of the transistor TR6 to the low level voltage. Thereby, the shift register SL1 completely stops outputting the scanning signal SC1.

The circuit structures of other shift registers (such as SR1, SL1, SR2, and the like) are speculated from the aforesaid description of the shift register SL1 and the operation methods thereof are also similar to that of the shift register SL1. The following descriptions depict the difference among the shift registers. In the even shift registers (such as SL2 and SL4) of the gate driving circuit 131, the drains of the transistors TR1 receive the prior scanning signals (such as SC2 and SC6), the gates of the transistors TR2 and TR8 receive the clocking signal CK1, the gates of the transistors TR3 and TR9 receive the subsequent scanning signals (such as SC4 and SC8), the drains of the transistors TR6 receive the clocking signal CKB1, and the sources of the transistors TR6 output the scanning signals (such as SC3 and SC7).

In the odd shift registers (such as SL3) of the gate driving circuit 131 besides the shift register SL1, the drains of the transistors TR1 receive the prior scanning signals (such as SC4), the gates of the transistors TR2 and TR8 receive the clocking signal CKB1, the gates of the transistors TR3 and TR9 receive the subsequent scanning signals (such as SC6), the drains of the transistors TR6 receive the clocking signal CK1, and the sources of the transistors TR6 output the scanning signals (such as SC5).

In the odd shift registers (such as SR1 and SR3) of the gate driving circuit 132, the drains of the transistors TR1 receive the prior scanning signals (such as SC1 and SC5), the gates of the transistors TR2 and TR8 receive the clocking signal CKB2, the gates of the transistors TR3 and TR9 receive the subsequent scanning signals (such as SC3 and SC7), the drains of the transistors TR6 receive the clocking signal CK2, and the sources of the transistors TR6 output the scanning signals (such as SC2 and SC6).

In the even shift registers (such as SR2 and SR4) of the gate driving circuit 132, the drains of the transistors TR1 receive the prior scanning signals (such as SC3 and SC7), the gates of the transistors TR2 and TR8 receive the clocking signal CK2, the gates of the transistors TR3 and TR9 receive the subsequent scanning signals (such as SC5 and SC9), the drains of the transistors TR6 receive the clocking signal CKB2, and the sources of the transistors TR6 output the scanning signals (such as SC4 and SC8).

Figure 4:
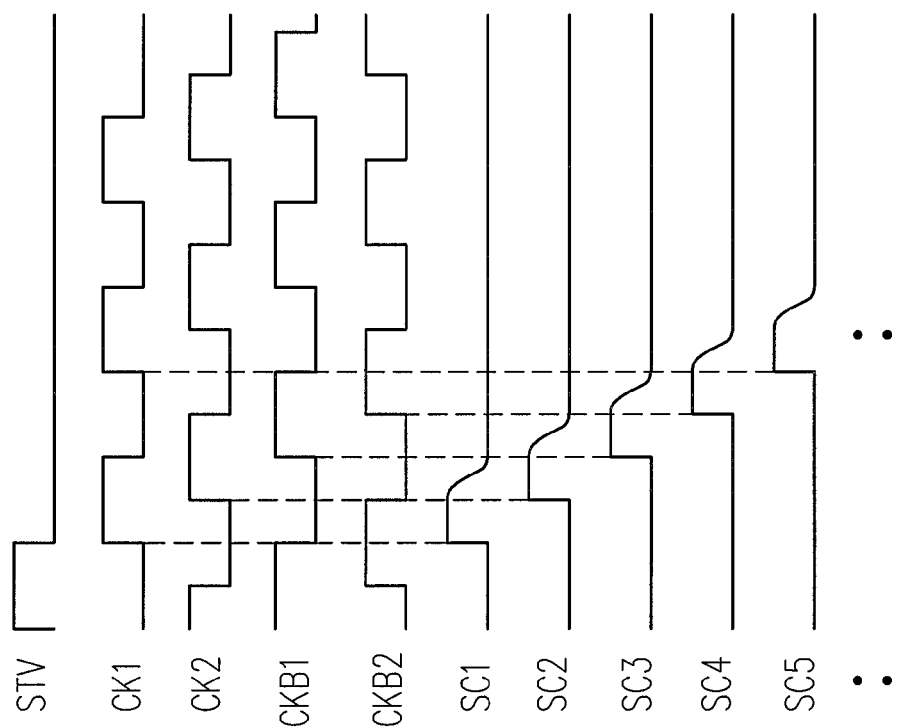
FIG. 4 is a schematic diagram showing a driving waveform of the shift register in FIG. 1 without the transistor TR9.

According to the aforesaid description, each shift register instantly stops outputting the scanning signal through the transistor TR9 therein when the subsequent scanning signal is outputted so as to prevent from the overlapping of the scanning signals, wherein the driving waveform of the shift register without disposing the transistor TR9 are illustrated in the following to further clarify the invention. FIG. 4 is a schematic diagram showing a driving waveform of the shift register in FIG. 1 without the transistor TR9. Referring to FIG. 1 to FIG. 4, under the condition that the shift register (such as SL1) is not disposed with the transistor TR9, if the shift register (such as SL1) receives the subsequent scanning signal (such as SC2), the transistor TR3 is in the conducted mode to pull down the voltage of the gate of the transistor TR6. Owing to the influence of the capacitor C2, the conducted transistor TR3 is insufficient to instantly pull down the voltage of the gate of the transistor TR6 so that the scanning signal (such as SC1) outputted from the shift register (such as SL1) can not be intermitted stopped but gradually reduced. Therefore, the scanning signal (such as SC1) outputted from each shift register (such as SL1) may be overlapped with the subsequent scanning signal (such as SC2) to render the display data written into a wrong pixel.

It is noted that the pixel array 120 in the aforesaid embodiment are exemplified as a pixel array having dual gate structure. Nevertheless, in other embodiments, the pixel array 120 can be a conventional pixel array, e.g. each pixel row in the pixel array is disposed corresponding to one scan line and each pixel in each row is connected to one data line. Furthermore, the scanning signals SC1, SC3, SC5, SC7, and the like outputted from the gate driving circuit 131 are respectively transmitted to odd scan lines (such as 121_1, 121_3, and the like) of the pixel array 120 to drive the pixels in odd rows and the scanning signals SC2, SC4, SC6, SC8 . . . outputted from the gate driving circuit 132 are respectively transmitted to even scan lines (such as 121_2, 121_4, and the like) of the pixel array 120 to drive the pixels in the even rows.

In view of the above, in the display panel of the invention, each shift register stops outputting the outputted scanning signals when the subsequent scanning signal is outputted. Furthermore, the output terminal of each shift register is disposed with a pull-down transistor (i.e. the transistor TR9) so as to instantly stop outputting the scanning signal when the subsequent scanning signal is outputted. Thereby, the scanning signals are prevented from overlapping with one another. Furthermore, the dual-gate structure can be adopted in the pixel array of the display panel so as to reduce the amount of the source drivers and reduce the cost of the circuit. In addition, the gate driving circuit can be fabricated simultaneously with the pixels during the manufacture of the panel so as to save the cost of the gate driver, simplify the design of outer circuit, and reduce the power consumption of the overall display panel.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A display panel, comprising:
a substrate;
a pixel array disposed on the substrate;
a plurality of first shift registers disposed on the substrate for outputting a plurality of first scanning signals sequentially; and
a plurality of second shift registers disposed on the substrate for outputting a plurality of second scanning signals sequentially,
wherein a $j^{th}$ first shift register stops outputting a $j^{th}$ first scanning signals according to a $j^{th}$ second scanning signal, a $j^{th}$ second shift register stops outputting the $j^{th}$ second scanning signal according to the $(j+1)^{th}$ first scanning signal while j is a positive integer, and the first scanning signals and the second scanning signals are used for driving the pixel array, each of the first shift registers comprises:
a first transistor, a first terminal of the first transistor being coupled to a control terminal of the first transistor;
a second transistor, a first terminal of the second transistor being coupled to the first terminal of the first transistor, a second terminal of the second transistor being coupled to a second terminal of the first transistor;
a third transistor, a first terminal of the third transistor being coupled to the second terminal of the first transistor, a second terminal of the third transistor being coupled to a gate low voltage;
a fourth transistor, a first terminal of the fourth transistor being coupled to the second terminal of the first transistor, a second terminal of the fourth transistor being coupled to the gate low voltage;
a fifth transistor, a first terminal of the fifth transistor being coupled to a control terminal of the fourth transistor, a second terminal of the fifth transistor being coupled to the gate low voltage, a control terminal of the fifth transistor being coupled to the second terminal of the first transistor;
a sixth transistor, a control terminal of the sixth transistor being coupled to the second terminal of the first transistor;
a seventh transistor, a first terminal of the seventh transistor being coupled to a second terminal of the sixth transistor, a second terminal of the seventh transistor being coupled to the gate low voltage, a control terminal of the seventh transistor being coupled to the control terminal of the fourth transistor;
an eighth transistor, a first terminal of the eighth transistor being coupled to the second terminal of the sixth transistor, a second terminal of the eighth transistor being coupled to the gate low voltage;
a ninth transistor, a first terminal of the ninth transistor being coupled to the second terminal of the sixth transistor, a second terminal of the ninth transistor being coupled to the gate low voltage;
a first capacitor, coupled between a first terminal of the sixth transistor and the first terminal of the fifth transistor; and
a second capacitor, coupled between the second terminal of the sixth transistor and the control terminal of the sixth transistor,
wherein, in a $1^{st}$ first shift register, the first terminal of the first transistor receives a start signal, the control terminal of the second transistor and the control terminal of the eighth transistor receive a reverse signal of a first clocking signal, a control terminal of the third transistor and a control terminal of the ninth transistor receive a $1^{st}$ second scanning signal, the first terminal of the sixth transistor receives the first clocking signal, the second terminal of the sixth transistor outputs a $1^{st}$ first scanning signal;
wherein, in a $2j^{th}$ first shift register, the first terminal of the first transistor receives a $(2j-1)^{th}$ second scanning signal, the control terminal of the second transistor and the control terminal of the eighth transistor receive the first clocking signal, the control terminal of the third transistor and the control terminal of the ninth transistor receive a $2j^{th}$ second scanning signal, the first terminal of the sixth transistor receives the reverse signal of the first clocking signal, the second terminal of the sixth transistor outputs a $2j^{th}$ first scanning signal;
wherein, in a $(2j+1)^{th}$ first shift register, the first terminal of the first transistor receives a $2j^{th}$ second scanning signal, the control terminal of the second transistor and the control terminal of the eighth transistor receive the reverse signal of the first clocking signal, the control terminal of the third transistor and the control terminal of the ninth transistor receive a $(2j+1)^{th}$ second scanning signal, the first terminal of the sixth transistor receives the first clocking signal, the second terminal of the sixth transistor outputs a $(2j+1)^{th}$ first scanning signal.

2. The display panel of claim 1, wherein each of the second shift registers comprises:
a tenth transistor, a first terminal of the tenth transistor being coupled to a control terminal of the tenth transistor;
an eleventh transistor, a first terminal of the eleventh transistor being coupled to the first terminal of the tenth transistor, a second terminal of the eleventh transistor being coupled to a second terminal of the tenth transistor;
a twelfth transistor, a first terminal of the twelfth transistor being coupled to the second terminal of the tenth transistor, a second terminal of the twelfth transistor being coupled to a gate low voltage;

a thirteenth transistor, a first terminal of the thirteenth transistor being coupled to the second terminal of the tenth transistor, a second terminal of the thirteenth transistor being coupled to the gate low voltage;

a fourteenth transistor, a first terminal of the fourteenth transistor being coupled to a control terminal of the thirteenth transistor, a second terminal of the fourteenth transistor being coupled to the gate low voltage, a control terminal of the fourteenth transistor being coupled to the second terminal of the tenth transistor;

a fifteenth transistor, a control terminal of the fifteenth transistor being coupled to the second terminal of the tenth transistor;

a sixteenth transistor, a first terminal of the sixteenth transistor being coupled to a second terminal of the fifteenth transistor, a second terminal of the sixteenth transistor being coupled 0 he gate low voltage, a control terminal of the sixteenth transistor being coupled to the control terminal of the thirteenth transistor;

a seventeenth transistor, a first terminal of the seventeenth transistor being coupled to the second terminal of the fifteenth transistor, a second terminal of the seventeenth transistor being coupled to the gate low voltage;

an eighteenth transistor, a first terminal of the eighteenth transistor being coupled to the second terminal of the fifteenth transistor, a second terminal of the eighteenth transistor being coupled to the gate low voltage;

a third capacitor, coupled between a first terminal of the fifteenth transistor and the first terminal of the fourteenth transistor; and a fourth capacitor, coupled between the second terminal of the fifteenth transistor and the control terminal of the fifteenth transistor, wherein, in a $(2j-1)^{th}$ second shift register, the first terminal of the tenth transistor receives a $(2j-1)^{th}$ first scanning signal, the control terminal of the eleventh transistor and the control terminal of the seventeenth transistor receive a reverse signal of a second clocking signal, the control terminal of the twelfth transistor and the control terminal of the eighteenth transistor receive a $2j^{th}$ first scanning signal, the first terminal of the fifteenth transistor receives the second clocking signal, the second terminal of the fifteenth transistor outputs a $(2j-1)^{th}$ second scanning signal; and in a $2j^{th}$ second shift register, the first terminal of the tenth transistor receives a $2j^{th}$ first scanning signal, the control terminal of the eleventh transistor and the control terminal of the seventeenth transistor receive the second clocking signal, the control terminal of the twelfth transistor and the control terminal of the eighteenth transistor receive a $(2j+1)^{th}$ first scanning signal, the first terminal of the fifteenth transistor receives the reverse signal of the second clocking signal, the second terminal of the fifteenth transistor outputs a $2j^{th}$ second scanning signal.

3. The display panel of claim 1, wherein pixels in odd rows of the pixel array are driven by the first scanning signals and pixels in even rows of the pixel array are driven by the second scanning signals.

4. The display panel of claim 1, wherein pixels in each row of the pixel array are corresponding to two scan lines.

5. The display panel of claim 4, wherein odd pixels in each row of the pixel array are driven by the first scanning signals and even pixels in each row of the pixel array are driven by the second scanning signals.

6. The display panel of claim 1, wherein the first shift registers are disposed at a first side of the pixel array and the second shift registers are disposed at a second side of the pixel array.

7. The display panel of claim 6, further comprising:
a first signal line disposed on the substrate and located at the first side of the pixel array, and the first signal line being used for transmitting a first clocking signal to the first shift registers;
a second signal line disposed on the substrate and located at the first side of the pixel array, and the second signal line being used for transmitting a reverse signal of the first clocking signal to the first shift registers;
a third signal line disposed on the substrate and located at the second side of the pixel array, and the third signal line being used for transmitting a second clocking signal to the second shift registers; and
a fourth signal line disposed on the substrate and located at the second side of the pixel array, and the fourth signal line being used for transmitting a reverse signal of the second clocking signal to the second shift registers.

* * * * *